(12) United States Patent
Antonin et al.

(10) Patent No.: US 10,914,760 B2
(45) Date of Patent: Feb. 9, 2021

(54) CHANGING THE MANNER IN WHICH AN ELECTRONIC TEST INSTRUMENT FILTERS AN INPUT SIGNAL BASED ON A CHARACTERISTIC OF THE ELECTRONIC TEST INSTRUMENT

(71) Applicant: Teledyne LeCroy, Inc., Thousand Oaks, CA (US)

(72) Inventors: Frederic Antonin, Pearl River, NY (US); Jesse Smith, Emerson, NJ (US)

(73) Assignee: Teledyne LeCroy, Inc., Thousand Oaks, CA (US)

( * ) Notice: Subject to any disclaimer, the term of this patent is extended or adjusted under 35 U.S.C. 154(b) by 52 days.

(21) Appl. No.: 16/404,927

(22) Filed: May 7, 2019

(65) Prior Publication Data
US 2020/0355729 A1 Nov. 12, 2020

(51) Int. Cl.
*G01R 13/02* (2006.01)
(52) U.S. Cl.
CPC ....... *G01R 13/029* (2013.01); *G01R 13/0272* (2013.01)
(58) Field of Classification Search
CPC .............. G01R 31/3171; G01R 13/029; G01R 13/0272
See application file for complete search history.

(56) References Cited

U.S. PATENT DOCUMENTS

| | | | | |
|---|---|---|---|---|
| 6,717,392 B2* | 4/2004 | Pearson | ............... | G01R 29/085 324/624 |
| 7,161,515 B2* | 1/2007 | Slavin | ................. | H03M 1/1033 341/120 |
| 9,070,856 B1* | 6/2015 | Rose | ..................... | H01L 41/042 |
| 2018/0205621 A1* | 7/2018 | Ungar | ............... | G01R 31/31905 |

OTHER PUBLICATIONS

X-Stream II Technical Brief, Teledyne LeCroy, Inc., pp. 1-9, Jun. 30, 2008. https://teledynelecroy.com/doc/xstream-ii-technical-brief.

* cited by examiner

*Primary Examiner* — Reena Aurora
(74) *Attorney, Agent, or Firm* — Andrew Dommer (57) ABSTRACT

In general, the subject matter described in this disclosure can be embodied in methods, systems, and program products for changing the manner in which an input signal is filtered based on a characteristic of an electronic test instrument. The method includes receiving, by the electronic test instrument, user input that modifies a characteristic of a channel of the electronic test instrument, and as a result changing the electronic test instrument from having the first digital filtering configuration to having a second digital filtering configuration, the first digital filtering configuration specifying that all or a majority of digital filtering occurs after the acquisition memory in the channel and the second digital filtering configuration specifying that all or a majority of digital filtering occurs before the acquisition memory in the channel.

19 Claims, 6 Drawing Sheets

CHANGING THE MANNER IN WHICH AN ELECTRONIC TEST INSTRUMENT FILTERS AN INPUT SIGNAL BASED ON A CHARACTERISTIC OF THE ELECTRONIC TEST INSTRUMENT

TECHNICAL FIELD

This document generally relates to dynamically changing the manner in which an electronic test instrument filters an input signal based on a characteristic of the electronic test instrument, such as the operating mode.

BACKGROUND

Some electronic test instruments (e.g., oscilloscopes) are designed to acquire input signals and present portions of the acquired input signals on corresponding display devices. Components of the acquisition channel in such an electronic test instrument do not necessarily have ideal properties therefore distort a signal as it is acquired. Similarly, the probe that attaches to the input of the electronic test instrument can distort the signal as it is acquired. An electronic test instrument can compensate for these distortions by modifying a digital representation of the signal after the digital representation of the signal has been stored in memory. This signal modification may be performed by a general purpose processor based on pre-programmed software instructions.

SUMMARY

This document describes techniques, methods, systems, and other mechanisms for changing the manner in which an electronic test instrument filters an input signal based on a characteristic of the electronic test instrument, such as the operating mode. Rather than the electronic test instrument modifying a digital representation of a signal the same regardless of the configuration of the electronic test instrument, various embodiments described herein involve an electronic test instrument implementing digital filters in hardware with a reconfigurable digital hardware filter, changing the structure and/or location of the digital filters as the configuration of the electronic test instrument changes in order to optimize the filter response for the available filter resources.

As an example, an electronic test instrument includes a reconfigurable digital hardware filter that filters the signal after the acquisition memory in a channel, such that signal data being read from the acquisition memory is run through the digital filter to modify the signal data before the signal data is further processed or stored in a second memory storage. Implementing the filter with a reconfigurable digital hardware filter enables the electronic test instrument to change characteristics of the filter based on characteristics of the electronic test instrument. For example, user input that changes settings of the electronic test instrument (e.g., sample rate, acquisition memory length) can prompt the electronic test instrument to instruct the reconfigurable digital hardware filter to change (1) the coefficients assigned to each stage of the digital filter, (2) the structure of the digital filter (e.g., implement a filter with a different number of stages/taps or parallelization level to increase throughput), and/or (3) a location of the filter, such that the filter is before the acquisition memory in the channel, behind the acquisition memory in the channel, or both.

Such implementations allow an electronic test instrument to tailor its use of the reconfigurable digital hardware filter to optimize the filtering capabilities within the available filter resources. For example, in a mode where the acquisition data is not decimated, the reconfigurable digital hardware filter can be placed after the acquisition memory where throughput requirement can be relaxed. This allows to trade the filtering resources used for parallelization to implement a much longer filter using those same resources.

In modes in which the reconfigurable digital hardware filter is decimating the signal, the electronic test instrument can implement a filter before the acquisition memory and before any samples are discarded by the decimation process. As such, the electronic test instrument may filter a fully-sampled version of the input signal, rather than a decimated version of the input signal. Filtering a signal that has already been decimated may not be ideal because the filter is operating on incomplete data, and it is better in some circumstances to filter on complete signal data. As mentioned above, a tradeoff to filtering before decimation is that the filter may have to filter the input signal in real time at the speed that the signal is received, sampled, and converted from analog to digital representation. As such, the filter may not be able to be as robust (e.g., the filter may have fewer stages because each stage of the filter may require more compute elements of the reconfigurable digital hardware filter to handle the increased throughput).

The technologies described herein offer multiple additional advantages, some of which are described throughout the remainder of this document, with even more apparent to skilled artisans. Below is a collection of example implementations of the technology described in this disclosure, with multiple variations of those implementations (and different implementations) described throughout the remainder of this disclosure.

As additional description to the embodiments described below, the present disclosure describes the following embodiments.

Embodiment 1 is a method for changing the manner in which an input signal is filtered based on a characteristic of an electronic test instrument. The method comprises receiving, by the electronic test instrument while the electronic test instrument is in a first digital filtering configuration, a first signal at a physical input to a channel of the electronic test instrument. The method comprises generating, by the electronic test instrument while in the first digital filtering configuration, a digital representation of the first signal by sampling the first signal with an analog-to-digital converter. The method comprises storing, by the electronic test instrument while in the first digital filtering configuration, the digital representation of the first signal in acquisition memory of the electronic test instrument. The method comprises accessing, by the electronic test instrument while in the first digital filtering configuration, the digital representation of the first signal from the acquisition memory, and digitally filtering the digital representation of the first signal that was accessed from the acquisition memory while the electronic test instrument is in the first digital filtering configuration. The method comprises receiving, by the electronic test instrument, user input that modifies a characteristic of the channel of the electronic test instrument, and as a result changing the electronic test instrument from having the first digital filtering configuration to having a second digital filtering configuration, the first digital filtering configuration specifying that all or a majority of digital filtering occurs after the acquisition memory in the channel and the second digital filtering configuration specifying that all or a majority of digital filtering occurs before the acquisition memory in the channel. The method comprises receiving, by the electronic test instrument while in the second digital filtering configuration, a second signal at the physical input to the channel of the electronic test instrument. The method comprises generating, by the electronic test instrument while in the second digital filtering configuration, a digital representation of the second signal by sampling the second signal with the analog-to-digital converter. The method comprises digitally filtering, by the electronic test instrument while in the second digital filtering configuration, the digital representation of the second signal before the digital representation of the second signal is stored by the acquisition memory. The method comprises storing, by the electronic test instrument while in the second digital filtering configuration, the digital representation of the second signal that has been digitally filtered in acquisition memory. The method comprises accessing, by the electronic test instrument while the electronic test instrument is in the second digital filtering configuration, the digital representation of the second signal from acquisition memory.

Embodiment 2 is the method of embodiment 1. The electronic test instrument includes a reconfigurable digital hardware filter. Digitally filtering the digital representation of the first signal while in the first digital filtering configuration comprises the reconfigurable digital hardware filter digitally filtering the digital representation of the first signal using the first digital filtering configuration. Digitally filtering the digital representation of the second signal while in the second digital filtering configuration comprises the reconfigurable digital hardware filter digitally filtering the digital representation of the second signal using the second digital filtering configuration.

Embodiment 3 is the method of embodiment 2, wherein the first digital filtering configuration has all digital filtering performed by the reconfigurable digital hardware filter occurring after the acquisition memory in the channel and no digital filtering by the reconfigurable digital hardware filter occurring before the acquisition memory in the channel.

Embodiment 4 is the method of embodiment 3, wherein the second digital filtering configuration has all digital filtering by the reconfigurable digital hardware filter occurring before the acquisition memory in the channel and no digital filtering by the reconfigurable digital hardware filter occurring after the acquisition memory in the channel.

Embodiment 5 is the method of embodiment 1, wherein receiving the user input that modifies the characteristic of the channel of the electronic test instrument comprises receiving user input that changes a setting of the electronic test instrument that causes the electronic test instrument to change from not decimating a digital representation of a signal acquired by the channel to decimating the digital representation of the signal acquired by the channel. The method further comprises decimating, by the electronic test instrument while in the second digital filtering configuration, the digital representation of the second signal after the digital representation of the second signal has been filtered and before the digital representation of the second signal has been stored in the acquisition memory, the digital representation of the second signal that the electronic test instrument stores in the acquisition memory being a decimated version of the digital representation of the second signal.

Embodiment 6 is the method of embodiment 5, wherein receiving the user input that modifies the characteristic of the channel of the electronic test instrument comprises receiving user input that changes the electronic test instrument from sampling at a full sample rate to sampling at a rate below the full sample rate.

Embodiment 7 is the method of embodiment 5, wherein receiving the user input that modifies the characteristic of the channel of the electronic test instrument comprises receiving user input that increases a time period of signal storage by the acquisition memory to be greater than a time period that the acquisition memory is capable of storing the signal acquired by the channel at a full sample rate.

Embodiment 8 is the method of embodiment 1. Digitally filtering the digital representation of the first signal while the electronic test instrument is in the first digital filtering configuration comprises digitally filtering the digital representation of the first signal to compensate for changes to the first signal caused by the physical input to the channel of the electronic test instrument and a physical probe used to acquire the first signal and provide the first signal to the physical input to the channel. Digitally filtering the digital representation of the second signal while the electronic test instrument is in the second digital filtering configuration comprises digitally filtering the digital representation of the second signal to compensate for changes to the second signal caused by the physical input to the channel of the electronic test instrument and a physical probe used to acquire the second signal and provide the second signal to the physical input to the channel.

Embodiment 9 is the method of embodiment 1, The first digital filtering configuration implements a first filter having a first number of stages after the acquisition memory in the channel, the first digital filtering configuration implementing the first filter using a first amount of compute elements for each stage of the first filter. The second digital filtering configuration implements a second filter having a second number of stages before the acquisition memory in the channel, the second digital filtering configuration implementing the second filter using a second amount of compute elements for each stage of the second filter. The first filter is longer than the second filter, such that the first number of stages of the first filter is greater than the second number of stages of the second filter. The second filter is implemented using more compute elements for each stage of the second filter than is used for each stage of the first filter, such that the second amount of compute elements per stage of the second filter is greater than the first amount of compute elements per stage of the first filter.

Embodiment 10 is the method of embodiment 1. The first digital filtering configuration uses a same collection of compute elements of a reconfigurable digital hardware filter, configured to perform the digital filtering of the digital representation of the first signal accessed from the acquisition memory. The second digital filtering configuration uses the same collection of compute elements of the reconfigurable digital hardware filter, reconfigured to perform the digital filtering of the digital representation of the second signal before the digital representation of the second signal is stored by the acquisition memory.

Embodiment 11 is an electronic test instrument. The instrument comprises a physical input for a channel of the electronic test instrument to receive a signal. The instrument comprises an analog-to-digital converter after the physical input in the channel receive the signal from the physical input and generate a digital representation of the signal. The instrument comprises acquisition memory after the analog-to-digital converter in the channel to store the digital representation of the signal. The instrument comprises a reconfigurable digital hardware filter configured to switch from (i) implementing a digital filter after the acquisition memory in the channel to (ii) implementing a digital filter between the analog-to-digital converter and the acquisition memory in the channel. The instrument comprises second memory after the acquisition memory in the channel to store the digital representation of the signal after retrieval of the digital representation of the signal from the acquisition memory. The instrument comprises a user interface to receive user input specifying an operating condition of the electronic test instrument. The instrument comprises a computer to change a configuration of the reconfigurable digital hardware filter from (i) a first digital filter configuration that implements all or a majority of digital filtering performed by the reconfigurable digital hardware filter after the acquisition memory in the channel, to (ii) a second digital filter configuration that implements all or a majority of digital filtering performed by the reconfigurable digital hardware filter before the acquisition memory in the channel, based on the computer determining that user input interacted with the user interface to change the operating condition of the electronic test instrument.

Embodiment 12 is the electronic test instrument of embodiment 11. The first digital filter configuration implements all digital filtering performed by the reconfigurable digital hardware filter after the acquisition memory in the channel. The second digital filter configuration implements at least some digital filtering performed by the reconfigurable digital hardware filter before the acquisition memory in the channel.

Embodiment 13 is the electronic test instrument of embodiment 11. The first digital filter configuration implements all digital filtering performed by the reconfigurable digital hardware filter after the acquisition memory in the channel. The second digital filter configuration implements all digital filtering performed by the reconfigurable digital hardware filter before the acquisition memory in the channel.

Embodiment 14 is the electronic test instrument of embodiment 11, wherein the computer is configured to change the configuration of the reconfigurable digital hardware filter from the first digital filter configuration to the second digital filter configuration, based on the computer determining that user input interacted with the user interface to change a setting of the electronic test instrument that causes the electronic test instrument to change from not decimating the digital representation of the signal before storage by the acquisition memory to decimating the digital representation of the signal before storage by the acquisition memory.

Embodiment 15 is the electronic test instrument of embodiment 14, wherein the user input that changes the setting includes user input that changes the electronic test instrument from sampling at a full sample rate to sampling at a rate below the full sample rate.

Embodiment 16 is the electronic test instrument of embodiment 14, wherein the user input that changes the setting includes user input that increases a time period of signal storage by the acquisition memory to be greater than a time period that the acquisition memory is capable of storing the signal at a full sample rate.

Embodiment 17 is the electronic test instrument of embodiment 11. The first digital filtering configuration implements a first filter having a first number of stages after the acquisition memory in the channel, the first digital filtering configuration implementing the first filter using a first amount of compute elements for each stage of the first filter. The second digital filtering configuration implements a second filter having a second number of stages before the acquisition memory in the channel, the second digital filtering configuration implementing the second filter using a second amount of compute elements for each stage of the second filter. The first filter is longer than the second filter, such that the first number of stages of the first filter is greater than the second number of stages of the second filter. The second filter is implemented using more compute elements for each stage of the second filter than is used for each stage of the first filter, such that the second amount of compute elements per stage of the second filter is greater than the first amount of compute elements per stage of the first filter.

Embodiment 18 is the electronic test instrument of embodiment 11. The first digital filter configuration uses a same collection of compute elements of the reconfigurable digital hardware filter to implement the digital filter after the acquisition memory in the channel. The second digital filter configuration uses the same collection of compute elements of the reconfigurable digital hardware filter to implement the digital filtering between the analog-to-digital converter and the acquisition memory in the channel.

Embodiment 19 is a method for configuring an electronic instrument to analyze an input signal. The method comprises receiving, by the electronic test instrument while the electronic test instrument is in a first digital filtering configuration, a first signal at a physical input to a channel of the electronic test instrument. The method comprises generating, by the electronic test instrument while in the first digital filtering configuration, a digital representation of the first signal by sampling the first signal with an analog-to-digital converter. The method comprises digitally filtering, by the electronic test instrument while in the first digital filtering configuration, the digital representation of the first signal using a first filter implemented by a reconfigurable digital hardware filter, the first filter having a first number of stages. The method comprises storing, by the electronic test instrument while in the first digital filtering configuration, the digital representation of the first signal in memory after the digital representation of the first signal has been filtered with the first filter. The method comprises receiving, by the electronic test instrument, user input that modifies a characteristic of the channel of the electronic test instrument, and as a result changing the electronic test instrument from having the first digital filtering configuration to a second digital filtering configuration, the first digital filtering configuration specifying use of the first digital filter with the first number of stages and the second digital filtering configuration specifying use of a second digital filter with a second number of stages instead of the first digital filter, the second number of stages being different than the first number of stages. The method comprises receiving, by the electronic test instrument while in the second digital filtering configuration, a second signal at the physical input to the channel of the electronic test instrument. The method comprises generating, by the electronic test instrument while in the second digital filtering configuration, a digital representation of the second signal by sampling the second signal with the analog-to-digital converter. The method comprises digitally filtering, by the electronic test instrument while in the second digital filtering configuration, the digital representation of the second signal using the second filter that is implemented by the reconfigurable digital hardware filter. The method comprises storing, by the electronic test instrument, the digital representation of the second signal after the digital representation of the second signal has been filtered with the second filter.

The details of one or more implementations are set forth in the accompanying drawings and the description below. Other features, objects, and advantages will be apparent from the description and drawings, and from the claims.

DESCRIPTION OF DRAWINGS

Like reference symbols in the various drawings indicate like elements.

DETAILED DESCRIPTION

This document generally describes changing the manner in which an electronic test instrument filters an input signal based on a characteristic of the electronic test instrument.

Various types of electronic test instruments, such as oscilloscopes, can read in and acquire an input data signal. The electronic test instrument and/or the probe used to acquire the input data signal can distort characteristics of the input data signal (e.g., attenuate various frequencies) and a filter may be used to correct such distortions. In many circumstances, filtering the signal after the signal has been stored in memory is a preferred configuration because the filter may not have to process the signal in real time. As such, the design of the filter can prioritize filter accuracy over throughput.

In some circumstances, however, the electronic test instrument changes the input signal before the input signal is stored in memory, and there are often benefits in such circumstances to filtering the input signal before that signal is changed. One such example of an electronic test instrument changing a signal before storing the signal in memory is with a decimation process. A decimation process discards much of the data in the signal and only keeps one out of every N samples, with N being the decimation factor. This loss of information affects what can and cannot be corrected post-acquisition, even with a robust filter.

To preserve all filtering capabilities, a filter can be placed before the signal is modified (e.g., before the decimator and therefore before data is discarded). This pre-storage filter, however, may have to operate in real time mode, and therefore the filter may have to be designed to sustain the full pre-decimation data throughput even though much of the data will be discarded later in the acquisition process. Such a filter may require a parallel implementation where, for every filter tap, S compute elements are necessary (S being the Super Sample Rate factor).

For a high throughput data flow the S value can be significant, and since the number of compute elements is usually limited, this reduces the complexity of the pre-storage filter that can be implemented. For device that has X compute elements available, the maximum filter length may be X/S, if the signal is to be filtered in real time. When the system is not operating in decimated mode, there may not be any real-time filtering requirement, the filter can be placed post storage, and the structure of the filter can prioritize filter length over filter throughput.

This disclosure explains features of an electronic test instrument that can dynamically reconfigure digital filtering processing elements in an acquisition channel based on user settings or other characteristics of the signal processing chain.

Figure 1:
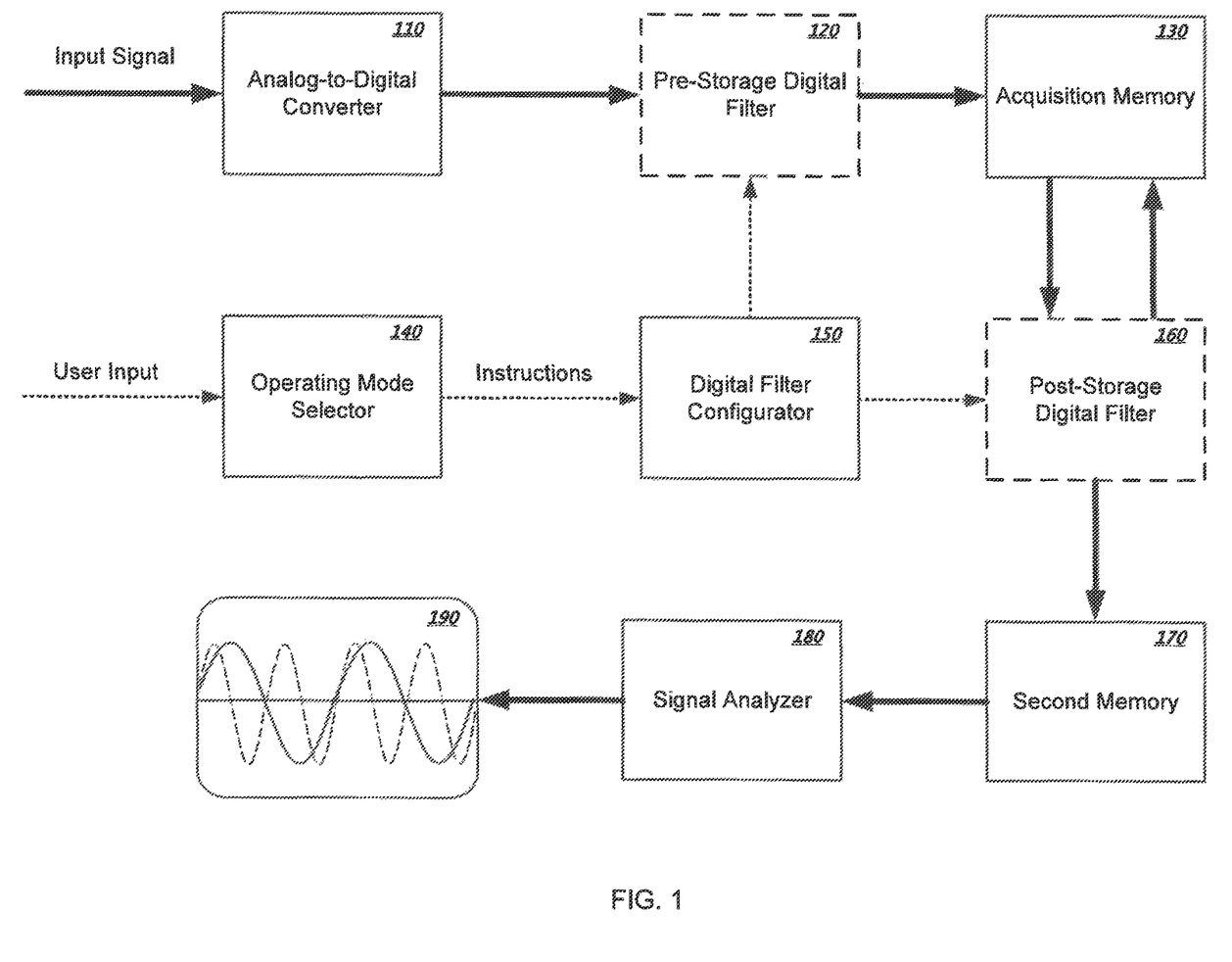
FIG. 1 shows an example structure of an electronic test instrument that can dynamically change the manner in which it filters an input signal based on a characteristic of the electronic test instrument.

FIG. 1 shows an example structure of an electronic test instrument that can dynamically change the manner in which the instrument filters an input signal, based on a characteristic of the electronic test instrument. At the top left of the figure, an analog-to-digital converter ("ADC") 110 receives an input signal. The input signal may be the signal that is received at a physical input to the electronic test instrument, for example, at a physical input terminal that is adapted to physically, and removably mate with a probe. A user may connect the probe to an external source of the signal, and the probe transfers the signal from the external source to the electronic test instrument. The input signal may undergo filtering by analog components before conversion by the ADC 110, but may not undergo filtering by digital components (indeed, the signal may not be in digital format at this point in the processing chain). The ADC 110 may convert the input signal into a digital signal (e.g., a time-series stream of numbers, such as numbers between 0 and 255 if the ADC 110 were an 8-bit ADC).

After the input signal is converted by the ADC 110 into a digital representation of the input signal (with the various forms of the input signal referred to sometimes in this disclosure as just the "signal" for simplicity of description), the signal may be filtered by a pre-storage digital filter 120, with the presence or non-presence of the pre-storage digital filter 120 being based on the filtering configuration of the electronic test instrument (e.g., whether the instrument is configured to filter the signal before the acquisition memory 130, after the acquisition memory 130, or both before or after the acquisition memory 130). This disclosure will discuss the various filtering configurations in additional detail below.

The signal is then stored by the acquisition memory 130, which may be a type of volatile memory (e.g., DRAM) that is capable of storing the values generated by the ADC 110 as fast as they are created. The acquisition memory 130 may store several seconds of signal data at full signal data acquisition rates, for example, at 30 GS/s. The acquisition memory 130 may be a first memory in the acquisition channel to store such signal data in digital form (e.g., more than 1000 data points of the signal).

After the signal has been converted to digital format and stored in acquisition memory 130, the electronic test instrument may access some or all of the signal that has been stored in acquisition memory 130 and "read out" that data into the second memory 170. The second memory 170 may be Personal Computer ("PC") memory 130 of a PC that is connected to the electronic test instrument or that is built into the electronic test instrument. This second memory 170 may not be dedicated solely to storing the acquired signal, as with the acquisition memory 130, and rather may also be used by the operating system of the PC for operations related to running the operating system and/or applications operating thereon.

Only a portion of the signal stored in acquisition memory 130 may be transferred to the second memory 170 at a time, and the portion that is transferred to second memory 170 may be specified by user input. For example, the acquisition memory 130 of the electronic test instrument may store multiple seconds of a signal at a very high sample rate, and a user of the electronic test instrument may interact with the electronic test instrument to zoom into and view a certain portion of the captured signal. It is this zoomed-in portion that the electronic test instrument may pass to the second memory 170, to generate a view of the zoomed-in portion of the signal and analyze features thereof. The PC and the second memory 170 may discard such signal data after it is no longer needed, even though this signal data (and indeed the entire collection of originally-captured signal data) may remain in the acquisition memory 130.

FIG. 1 shows that the electronic test instrument may pass the signal through a post-storage digital filter 160 as the signal is passed from the acquisition memory 130 to the second memory 170 (or alternatively back to acquisition memory 130 to overwrite pre-existing signal data or to be stored as additional signal data). Whether the signal is passed through the post-storage digital filter 160, and the structure of the post-storage digital filter 160, may depend on the configuration of the electronic test instrument, as discussed in additional detail elsewhere in this disclosure.

The signal analyzer 180 may analyze the signal that is stored in the second memory 170 and perform various computations on that signal, such as identifying a slope of a portion of the signal, a local maximum or minimum of a portion of the signal, generating an eye diagram representation of a portion of the signal, or performing any of various other mathematical computations to analyze or process characteristics of the signal and help a user analyze the signal. The signal analyzer 180 may represent functions performed by a general purpose processor of the electronic test instrument, and may be involved in preparing a graphical representation of the signal for display on the display device 190.

As mentioned above, whether the electronic test instrument implements a pre-storage digital filter 120, a post-storage digital filter 160, or both depends on how the acquisition channel of the electronic test instrument is configured. The operating mode selector 140 represents the portions of the electronic test instrument that interface with a user to specify the configuration of the instrument, while the digital filter configurator 150 represents the portions of the electronic test instrument that identify the configuration of the instrument and interact with programmable logic to specify the type of one or more filters to implement in the acquisition channel. The operating mode selector 140, the digital filter configurator 150, and the signal analyzer 180 may represent functions performed by the general purpose processor of the electronic test instrument, and may not have to be electronic modules distinct from one another.

Some instrument configurations may result in and be assigned only a pre-storage digital filter 120, other instrument configurations may result in and be assigned only a post-storage digital filter 160, and still other instrument configurations may result in and be assigned both a pre-storage digital filter 120 and a post-storage digital filter 160. It is the digital filter configurator 150 that may identify the current configuration of the electronic test instrument and adjust the digital filter configuration to correspond to the current instrument configuration. The pre-storage digital filter 120 and the post-storage digital filter 160 may be implemented by a programmable logic device, such as a Field Programmable Gate Array (FPGA) or an Application-Specific Integrated Circuit (ASIC). In other words, a programmable logic device may be reconfigurable to implement one or both of the pre-storage digital filter 120 and the post-storage digital filter 160.

A first example device configuration specified by user interaction with the operating mode selector 140 is a configuration in which the electronic test instrument does not decimate the signal. In such an example, the digital filter configurator 150 may configure the programmable logic device to implement the post-storage digital filter 160 and not implement the pre-storage digital filter 120.

Figure 2:
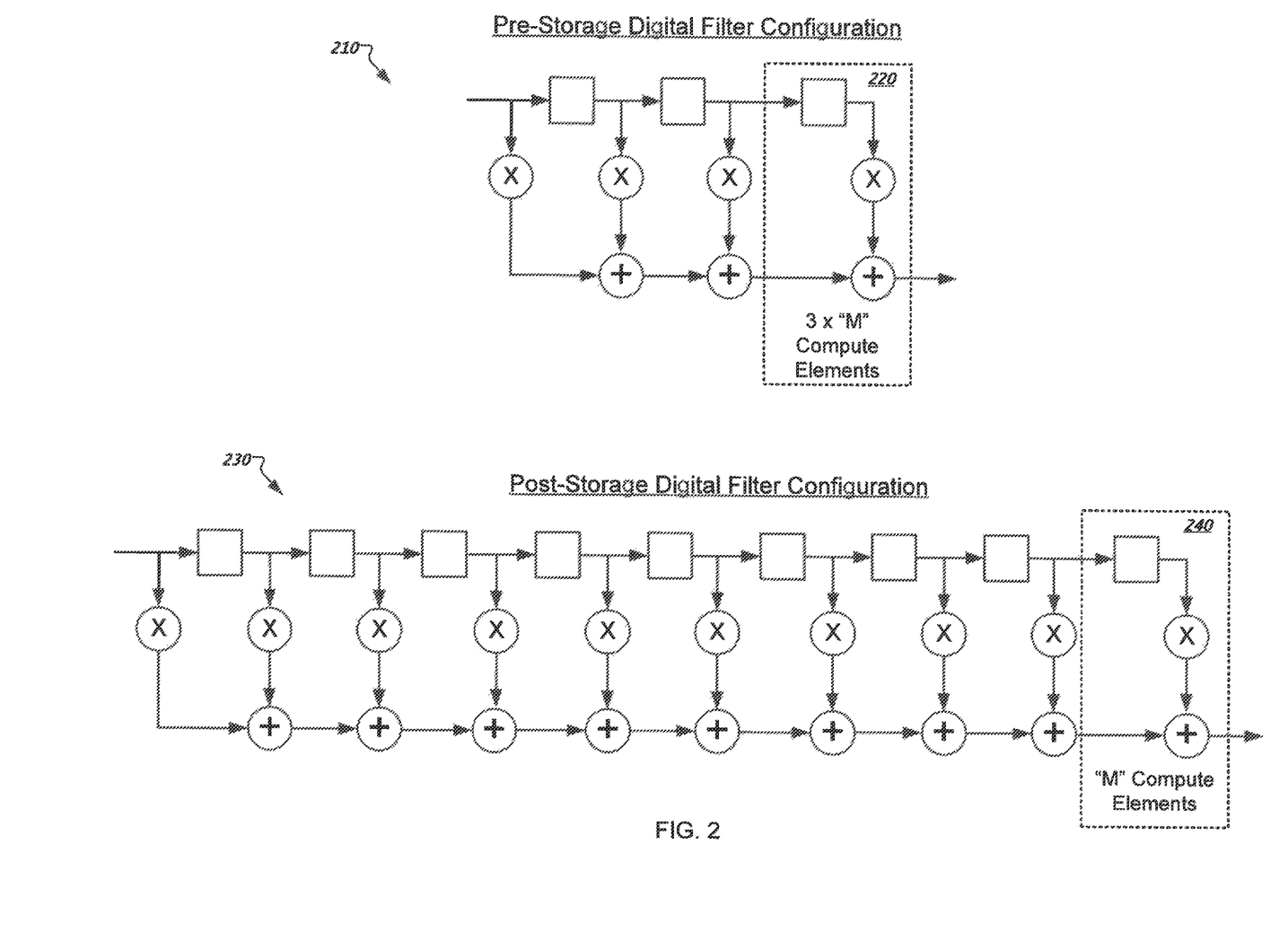
FIG. 2 shows an example pre-storage digital filter and an example post-storage digital filter.

Filter 230 in FIG. 2 shows an example post-storage digital filter configuration implemented by the programmable logic device when the electronic test instrument is configured to not decimate a signal. As previously explained, signal throughput may not be a primary concern in designing a post-storage filter because the signal is already stored by the acquisition memory 130 and therefore the signal need not be filtered in real time. As such, the design of filter 230 may prioritize filter length (e.g., number of taps or stages) over filter throughput. In this illustration, the filter has 9 stages, and each stage requires "M" compute elements (as illustrated by stage 240), with the programmable logic device using 9×"M" compute elements to implement the filter. Each compute element may be a block of the programmable logic device (e.g., a block of a reconfigurable digital hardware filter) that includes a multiplier and accumulator.

A second example device configuration specified by user interaction with the operating mode selector 140 is a configuration in which the electronic test instrument decimates the signal (e.g., because the user specified that the sample rate be lower than the nominal, full sample rate of the ADC 110). In such a circumstance, the digital filter configurator 150 may configure the programmable logic device to implement the pre-storage digital filter 120 and not implement the post-storage digital filter 160.

Filter 210 in FIG. 2 shows an example pre-storage digital filter configuration implemented by the programmable logic device when the electronic test instrument is configured to decimate a signal. As previously explained, signal throughput is a primary factor in designing a pre-storage filter because the signal has not been stored and must be filtered in real-time as the ADC 110 creates a stream of numbers. As such, the design of filter 210 may prioritize throughput, using compute elements in parallel to ensure that the filter can process the signal in real time. A tradeoff to throughput, as illustrated in FIG. 2, is that the same number of compute elements may only be able to support a filter of reduced length, with pre-storage filter 210 in FIG. 2 using the same number of 9 compute elements as filter 230, but forming a filter with only three stages (with each stage using 3×"M" compute elements, as illustrated by stage 220).

The example filter configurations shown in FIG. 2 involve scenarios in which all compute elements (9 in this example) are directed towards either the pre-storage digital filter 210 or the post-storage digital filter 230. Some filter configurations may involve programmable logic simultaneously implementing both a pre-storage digital filter and a post-storage digital filter, so that a signal is both filtered before the acquisition memory 130 and after the acquisition memory 130, as described in additional detail elsewhere in this disclosure.

Figure 3A:
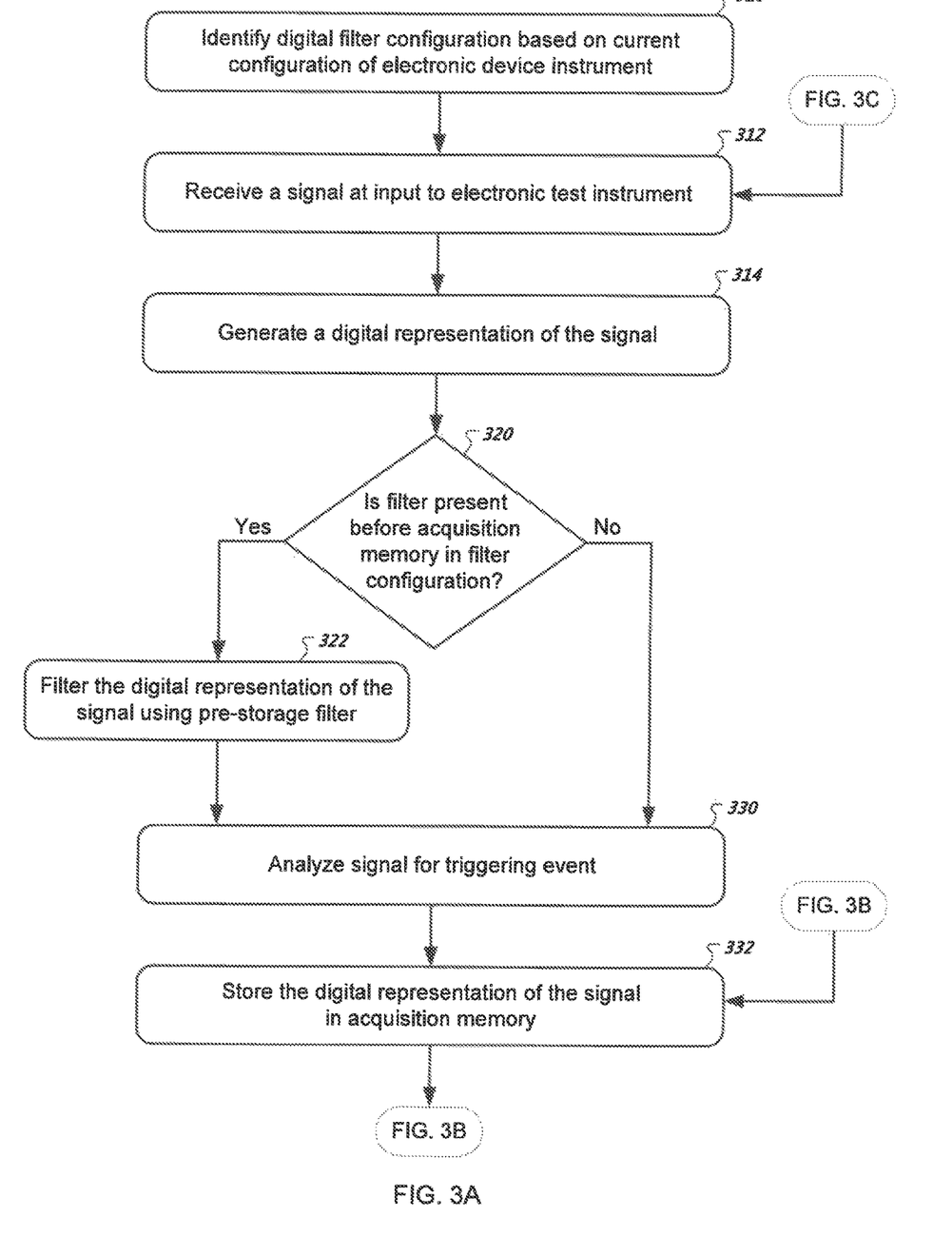
FIGS. 3A-C show a process for changing the manner in which an electronic test instrument filters an input signal based on a characteristic of the electronic test instrument.
Figure 3B:
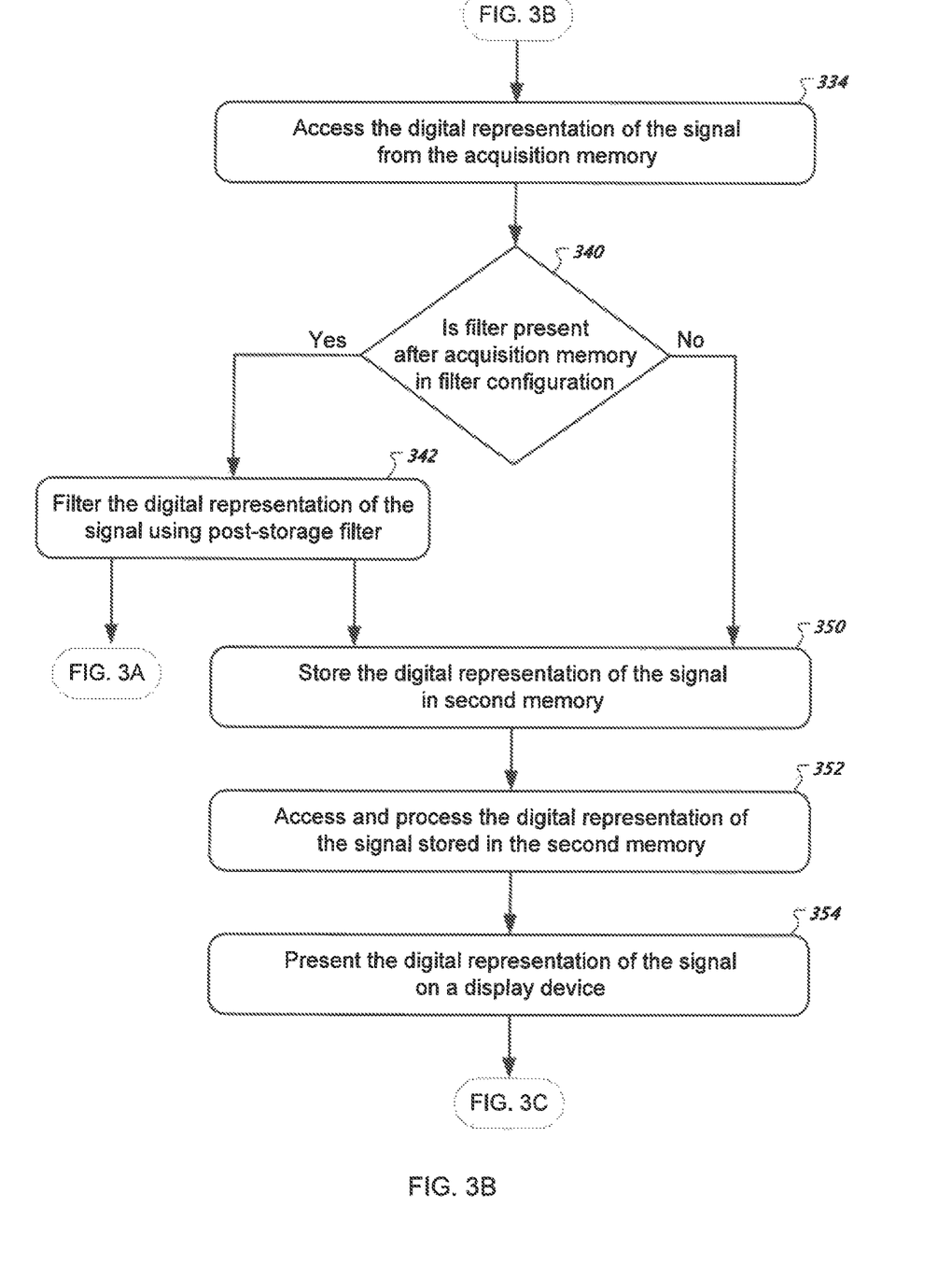
Figure 3C:
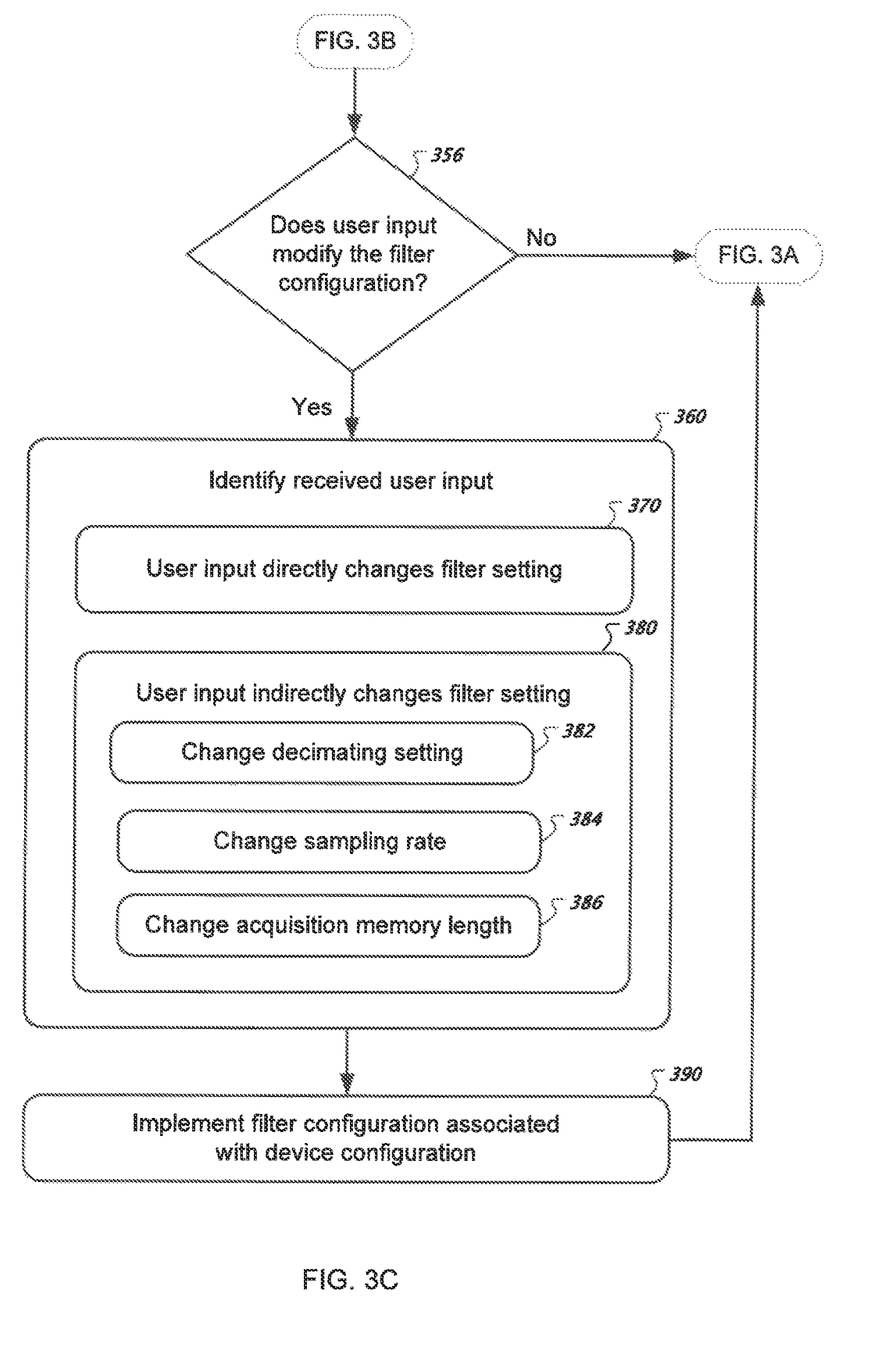

FIGS. 3A-C show a process for changing the manner in which an electronic test instrument filters an input signal based on a characteristic of the electronic test instrument.

At box 310, the electronic test instrument identifies the digital filter configuration based on a current configuration of the electronic test instrument. For example, a processor of the electronic test instrument may execute a process that determines a digital filter implementation that a reconfigurable digital hardware filter is to implement based on current configuration of the electronic test instrument. In electronic test instruments with multiple acquisition channels, the analyzed configuration and resulting digital filter implementation may be channel-specific, such that each channel may have a different digital filter implementation (indeed, each filter may have its own programmable logic for implementing one or more digital filters). Specific instrument/channel configurations and resulting digital filter implementations are discussed in additional detail with respect to boxes 360-390.

At box 312, the electronic test instrument receives a signal. For example, the electronic test instrument may include a physical input terminal for each acquisition channel, and the electronic test instrument may receive an analog electrical signal at a physical input terminal for one channel through a probe that a user has physically attached to the physical input terminal. Although the input signal may be analog, digital information may be encoded in the analog signal (e.g., the analog signal may alternate between two states, such as between 0 and 5 volts).

At box 314, the electronic test instrument may generate a digital representation of the signal. For example, the ADC 110 may receive the analog signal at an input to the ADC 110 and generate a sequence of numbers that represent a magnitude of the analog signal at different times. The sequence of numbers may be represented by digital values encoded across a parallel set of conductors (e.g., 16 conductors can represent a magnitude of the analog signal using 16-bit resolution).

At box 320, the flowchart shows a decision box with two branches that reflect whether or not a filter is present or not present before acquisition memory 130, in the current filter configuration. If there is a filter present before the acquisition memory, the electronic test instrument performs the operations of box 322 and filters the digital representation of the signal using a pre-storage filter. For example, the output of the ADC 110 may be processed by pre-storage digital filter 120.

If there is no filter implemented before the acquisition memory in the current filtering scheme, the electronic test instrument does not perform the operations of box 322. The electronic may selectively implement or not implement the pre-storage filtering of the input signal using one or more switches to route or not route the signal to programmable logic, or by always routing the signal to programmable logic but with the programmable logic not modifying the signal pre-storage in those configurations that implement the filter post-storage.

It should be understood that the decision box 320 is not necessarily an operation performed by the electronic test instrument in real time during signal processing. Rather, the electronic test instrument may change the filter implementation in response to user input that changes the device configuration, and decision box 320 is presented in the flowchart of FIGS. 3A-C to show the different processing flows that a signal may undergo, depending on a previously-implemented filter configuration.

Regardless whether the signal has been filtered pre-storage or not, the electronic test instrument may, at this point, perform the operations of box 330, which involve analyzing a signal in real time for, but not limited to, a triggering event, a mask test, or another real time measurement on the signal. This device operation may be optional and depends on whether a user has specified an operation at this particular location in the processing stream. This operation is shown in the flowchart of FIGS. 3A-C to illustrate how the pre-storage filtering at box 322 can potentially "flatten" a signal to remove distortions in the signal caused by the acquisition channel and/or probe, and facilitate more-accurate device triggering. In electronic test instruments that do not implement digital filtering before signal acquisition, the triggering may be performed by analog components rather than through digital analysis of the signal. In some implementations, the programmable logic may dedicate most of its compute elements to a post-memory filter implementation, but may still use a smaller amount of compute elements to simultaneously implement a pre-memory filter to improve trigger performance, even in scenarios that would not normally dictate a pre-memory filter (e.g., such as the device sampling at its full rate).

At box 332, the electronic test instrument stores the digital representation of the signal in the acquisition memory 130. If the signal has been filtered by pre-storage digital filter 120, then the stored signal data is the filtered digital representation of the signal. Otherwise, the signal data that is stored is unfiltered (at least digitally unfiltered). This may be the first portion of the processing chain in which the digital representation of the signal is stored, at least in any significant manner (e.g., with storage capable of simultaneously storing data for more than one million points in time). The acquisition memory 130 may be implemented as a buffer that writes over previous signal data once full, or may store signal data in a single shot that stops recording data once full.

At box 334, the electronic test instrument retrieves the digital representation of the signal from the acquisition memory 130. This retrieval does not necessarily involve accessing all of the signal data that is stored in acquisition memory 130, and may involve accessing only a portion of the signal data. For example, the acquisition memory 130 may include data for multiple seconds of a received signal, and a PC connected to or integrated into the electronic test instrument may only access a portion of that data at any given time, for example, to present a time-limited portion of the signal data on a display device or perform other processing or analytics on a respective portion of the signal data.

At box 340, the flowchart shows a decision box that illustrates an implementation in which there is a post-storage filter and an implementation in which there is not a post-storage filter. At box 342 (the left branch) the electronic test instrument filters the digital representation of the signal using a post-storage filter. For example, the programmable logic may implement a filter and switches may route signal data retrieved from the acquisition memory 130 through the programmable logic before the filtered signal data is stored in memory again. In some implementations (illustrated by the right arrow below box 340) the filtered signal data is passed to second memory 170 for storage. In some implementations (illustrated by the left arrow below box 340) the filtered signal data is passed back to the acquisition memory 130 to overwrite or not overwrite the initial signal data stored in acquisition memory 130. (Although not illustrated in the flowchart of FIGS. 3A-C, the electronic test instrument may later transfer such filtered data from acquisition memory 130 to the second memory 170 for processing and possible display by the PC). The post-storage filter may be more robust than a pre-storage filter generated with a similar amount of compute elements, but the processing speed may be slower (e.g., 1 GS/s vs. 20 GS/s).

At box 350, the digital representation of the signal is stored in second memory (either filtered with a post-storage filter or not filtered with a post-storage filter). This second memory may also be volatile memory (e.g., DRAM), but the second memory 170 and the processing components that read data into and out of the second memory 170 may be used for functions other than acquiring signal data. Rather, the second memory 170 and associated processing components may be used to support operating system functions and/or other electronic test instrument processes, and the operations that read data into and out of second memory 170 may be processed according to their order in a queue. In other words, the second memory 170 and/or the processing components that interact with the second memory 170 may not be dedicated to acquisition. Accessing signal data from the acquisition memory 130 may be referred to as the "read out," and the second memory 170 may read the data from the acquisition memory 130 via PCI express.

At box 352, the electronic test instrument accesses and processes the digital representation of the signal stored in the second memory 352. For example, the electronic test instrument may perform mathematical operations on the signal data stored in the second memory 352 to generate alternative representations of the signal data (e.g., an eye diagram, further filtering operations, identifying principal frequency components, etc.). The electronic test instrument may perform some of this processing as the signal data is moved from the acquisition memory 130 to the second memory 170. The electronic test instrument may also process the signal data as the data is stored in the second memory 170, changing the stored signal data in situ.

At box 354, the electronic test instrument presents a digital representation of the signal on display device 190. For example, the electronic test instrument may display a portion of the acquired signal on the display device 190, and a user may interact with the electronic test instrument to move around and view different portions of the signal, zoom into or out of the signal, and perform filtering and/or other types of processing on the signal to identify characteristics of the signal.

At box 356, the electronic test instrument determines whether user input modifies the filter configuration. If not, the flowchart returns to the operations of box 312, and the entire process repeats using the same filter configuration. If user input has been received that modifies the filter configuration, the flowchart performs the operations of box 360, which involves identifying the received user input and the filter configuration associated with that user input.

At box 370, the user input involves directly changing a filter setting. For example, the electronic test instrument may be designed so that user input is able to adjust whether programmable logic implements a pre-storage filter, a post-storage filter, or both. User input may also be able to adjust the structure of one or both of the filters and/or coefficients assigned to each stage of the filter, through interaction with a user interface of the electronic test instrument or by transferring a filter configuration to the electronic test instrument from another computing device over a data communication channel.

At box 380, the user input involves indirectly changing the filter setting. For example, the user input may change a setting that impacts whether the electronic test instrument decimates the signal, with user input that specifies that the instrument is to have a configuration that does not decimate the signal resulting in a digital filter implementation that is entirely or mostly post-storage (with the "amount" of digital filter resources being post- or pre-storage being based on the number of computational elements assigned post- or pre-storage, such as reconfigurable digital hardware filter compute elements). Similarly, user input that specifies that the instrument is to have a configuration that decimates the signal results in a digital filter implementation that is entirely or mostly pre-storage. Each of these filter implementations may not only have a pre-defined location, but a pre-defined structure and a listing of coefficients for the stages.

At box 382, the user input directly specifies a decimation level (e.g., a proportion of samples to decimate). In such a scenario, the electronic test instrument may determine that the decimation level has been changed, and may retrieve from memory a pre-determined filter configuration assigned to the user-specified decimation level.

At box 384, the user input changes the sampling rate. In scopes that continue to always sample the input signal at the same sampling rate regardless of the value that the user specifies for the sample rate, lowering the sampling rate is achieved from a user perspective by decimating some of the data received from the ADC 110. In such implementations, the electronic test instrument may select a pre-determined filter configuration assigned to the user-specified sampling rate (or the decimation rate that corresponds to the user-specified sampling rate).

At box 386, the user input changes the acquisition memory length. The acquisition memory 130 may be able to hold a number of data values that represent a certain length of signal acquisition at full conversion rate of ADC 110 (e.g., 5 seconds). A user may be able to adjust a length of acquisition to be greater than that certain length of signal acquisition (e.g., 20 seconds), and in response the electronic test instrument may decimate the signal to store fewer samples (e.g., one-in-four samples). In such implementations, the electronic test instrument may select a pre-determined filter configuration assigned to the user-specified length of acquisition (or the decimation rate that corresponds thereto).

At box 390, the electronic test instrument implements the filter configuration associated with the device configuration. For example, a general purpose processor of the electronic test instrument may identify the new device configuration, may select an appropriate filter configuration, and may send instructions to a reconfigurable digital hardware filter to implement the selected filter configuration. The electronic test instrument or the reconfigurable digital hardware filter may activate switches to route the signal to the reconfigurable digital hardware filter either before acquisition memory 130, after acquisition memory 130, or both. After the electronic test instrument has implemented the new filter configuration, the process may return to the operation of box 312 to receive a new input signal and process that signal.

Although this disclosure has primarily focused on decimation as a channel characteristic that affects the position and structure of a digital filter in the processing chain, other channel characteristics may affect the position and/or structure of a digital filter in the processing chain, such as but not limited to, changing analog channel response, the analog path/coupling, interpolation, decimation, the number of channels, and number of interleaved ADCs. For example, a user may place an electronic test instrument into a "combine" mode that utilizes the ADCs for two channels in the processing of a single input data stream received at the physical input of one of the channels. In such an operating mode, the electronic test instrument may have to change the reprogrammable hardware filter to spread its compute elements across twice as many ADCs. For example, the programmable hardware filter may implement a polyphaser filter that modifies the signal received from the ADCs originally-assigned to the channel differently than the signal received from the ADCs originally assigned to the other channel. The filter that processes the data received from each ADC may have half the number of stages/taps in the "combine" mode than when the filter had to process half as many ADCs.

This disclosure often refers to the ordering of components or operations in the channel of an electronic test instrument as being before or after another component or operation. This ordering should not be construed to negate the possibility of other intervening components or operations. For example, one or more components may exist between the ADC 110 and the pre-storage digital filter 120.

Figure 4:
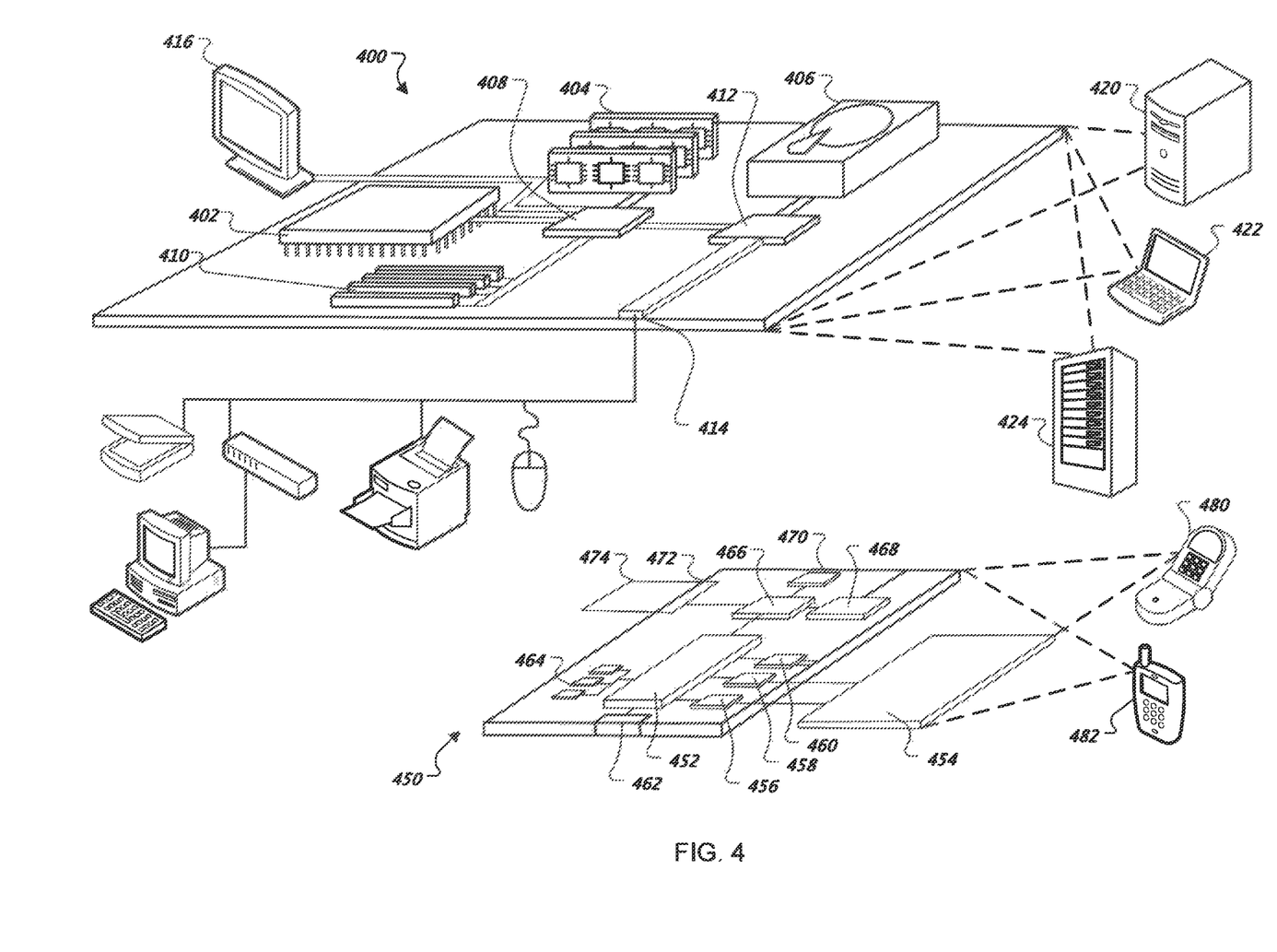
FIG. 4 is a block diagram of computing devices that may be used to implement at least portions of the systems and methods described in this document, as either a client or as a server or plurality of servers.

FIG. 4 is a block diagram of computing devices 400, 450 that may be used to implement at least portions of the systems and methods described in this document, as either a client or as a server or plurality of servers. For example, the operations of at least features 140, 150, 170, and 180 may be implemented by the computing devices 400 and/or 450 described below, while the features 110, 120, 130, and 160 may be implemented by special-purpose hardware, as described throughout this disclosure (although certain ones of those features may be implemented by general-purpose hardware in various implementations). Computing device 400 is intended to represent various forms of digital computers, such as laptops, desktops, workstations, personal digital assistants, servers, blade servers, mainframes, and other appropriate computers. Computing device 450 is intended to represent various forms of mobile devices, such as personal digital assistants, cellular telephones, smartphones, and other similar computing devices. The components shown here, their connections and relationships, and their functions, are meant to be examples only, and are not meant to limit implementations described and/or claimed in this document.

Computing device 400 includes a processor 402, memory 404, a storage device 406, a high-speed interface 408 connecting to memory 404 and high-speed expansion ports 410, and a low speed interface 412 connecting to low speed bus 414 and storage device 406. Each of the components 402, 404, 406, 408, 410, and 412, are interconnected using various busses, and may be mounted on a common motherboard or in other manners as appropriate. The processor 402 can process instructions for execution within the computing device 400, including instructions stored in the memory 404 or on the storage device 406 to display graphical information for a GUI on an external input/output device, such as display 416 coupled to high-speed interface 408. In other implementations, multiple processors and/or multiple buses may be used, as appropriate, along with multiple memories and types of memory. Also, multiple computing devices 400 may be connected, with each device providing portions of the necessary operations (e.g., as a server bank, a group of blade servers, or a multi-processor system).

The memory 404 stores information within the computing device 400. In one implementation, the memory 404 is a volatile memory unit or units. In another implementation, the memory 404 is a non-volatile memory unit or units. The memory 404 may also be another form of computer-readable medium, such as a magnetic or optical disk.

The storage device 406 is capable of providing mass storage for the computing device 400. In one implementation, the storage device 406 may be or contain a computer-readable medium, such as a floppy disk device, a hard disk device, an optical disk device, or a tape device, a flash memory or other similar solid state memory device, or an array of devices, including devices in a storage area network or other configurations. A computer program product can be tangibly embodied in an information carrier. The computer program product may also contain instructions that, when executed, perform one or more methods, such as those described above. The information carrier is a computer- or machine-readable medium, such as the memory 404, the storage device 406, or memory on processor 402.

The high-speed controller 408 manages bandwidth-intensive operations for the computing device 400, while the low speed controller 412 manages lower bandwidth-intensive operations. Such allocation of functions is an example only. In one implementation, the high-speed controller 408 is coupled to memory 404, display 416 (e.g., through a graphics processor or accelerator), and to high-speed expansion ports 410, which may accept various expansion cards (not shown). In the implementation, low-speed controller 412 is coupled to storage device 406 and low-speed expansion port 414. The low-speed expansion port, which may include various communication ports (e.g., USB, Bluetooth, Ethernet, wireless Ethernet) may be coupled to one or more input/output devices, such as a keyboard, a pointing device, a scanner, or a networking device such as a switch or router, e.g., through a network adapter.

The computing device 400 may be implemented in a number of different forms, as shown in the figure. For example, it may be implemented as a standard server 420, or multiple times in a group of such servers. It may also be implemented as part of a rack server system 424. In addition, it may be implemented in a personal computer such as a laptop computer 422. Alternatively, components from computing device 400 may be combined with other components in a mobile device (not shown), such as device 450. Each of such devices may contain one or more of computing device 400, 450, and an entire system may be made up of multiple computing devices 400, 450 communicating with each other.

Computing device 450 includes a processor 452, memory 464, an input/output device such as a display 454, a communication interface 466, and a transceiver 468, among other components. The device 450 may also be provided with a storage device, such as a microdrive or other device, to provide additional storage. Each of the components 450, 452, 464, 454, 466, and 468, are interconnected using various buses, and several of the components may be mounted on a common motherboard or in other manners as appropriate.

The processor 452 can execute instructions within the computing device 450, including instructions stored in the memory 464. The processor may be implemented as a chipset of chips that include separate and multiple analog and digital processors. Additionally, the processor may be implemented using any of a number of architectures. For example, the processor may be a CISC (Complex Instruction Set Computers) processor, a RISC (Reduced Instruction Set Computer) processor, or a MISC (Minimal Instruction Set Computer) processor. The processor may provide, for example, for coordination of the other components of the device 450, such as control of user interfaces, applications run by device 450, and wireless communication by device 450.

Processor 452 may communicate with a user through control interface 458 and display interface 456 coupled to a display 454. The display 454 may be, for example, a TFT (Thin-Film-Transistor Liquid Crystal Display) display or an OLED (Organic Light Emitting Diode) display, or other appropriate display technology. The display interface 456 may comprise appropriate circuitry for driving the display 454 to present graphical and other information to a user. The control interface 458 may receive commands from a user and convert them for submission to the processor 452. In addition, an external interface 462 may be provided in communication with processor 452, so as to enable near area communication of device 450 with other devices. External interface 462 may be provided, for example, for wired communication in some implementations, or for wireless communication in other implementations, and multiple interfaces may also be used.

The memory 464 stores information within the computing device 450. The memory 464 can be implemented as one or more of a computer-readable medium or media, a volatile memory unit or units, or a non-volatile memory unit or units. Expansion memory 474 may also be provided and connected to device 450 through expansion interface 472, which may include, for example, a SIMM (Single In Line Memory Module) card interface. Such expansion memory 474 may provide extra storage space for device 450, or may also store applications or other information for device 450. Specifically, expansion memory 474 may include instructions to carry out or supplement the processes described above, and may include secure information also. Thus, for example, expansion memory 474 may be provided as a security module for device 450, and may be programmed with instructions that permit secure use of device 450. In addition, secure applications may be provided via the SIMM cards, along with additional information, such as placing identifying information on the SIMM card in a non-hackable manner.

The memory may include, for example, flash memory and/or NVRAM memory, as discussed below. In one implementation, a computer program product is tangibly embodied in an information carrier. The computer program product contains instructions that, when executed, perform one or more methods, such as those described above. The information carrier is a computer- or machine-readable medium, such as the memory 464, expansion memory 474, or memory on processor 452 that may be received, for example, over transceiver 468 or external interface 462.

Device 450 may communicate wirelessly through communication interface 466, which may include digital signal processing circuitry where necessary. Communication interface 466 may provide for communications under various modes or protocols, such as GSM voice calls, SMS, EMS, or MMS messaging, CDMA, TDMA, PDC, WCDMA, CDMA2000, or GPRS, among others. Such communication may occur, for example, through radio-frequency transceiver 468. In addition, short-range communication may occur, such as using a Bluetooth, WiFi, or other such transceiver (not shown). In addition, GPS (Global Positioning System) receiver module 470 may provide additional navigation- and location-related wireless data to device 450, which may be used as appropriate by applications running on device 450.

Device 450 may also communicate audibly using audio codec 460, which may receive spoken information from a user and convert it to usable digital information. Audio codec 460 may likewise generate audible sound for a user, such as through a speaker, e.g., in a handset of device 450. Such sound may include sound from voice telephone calls, may include recorded sound (e.g., voice messages, music files, etc.) and may also include sound generated by applications operating on device 450.

The computing device 450 may be implemented in a number of different forms, as shown in the figure. For example, it may be implemented as a cellular telephone 480. It may also be implemented as part of a smartphone 482, personal digital assistant, or other similar mobile device.

Additionally, computing device 400 or 450 can include Universal Serial Bus (USB) flash drives. The USB flash drives may store operating systems and other applications. The USB flash drives can include input/output components, such as a wireless transmitter or USB conn-ector that may be inserted into a USB port of another computing device.

Various implementations of the systems and techniques described here can be realized in digital electronic circuitry, integrated circuitry, specially designed ASICs (application specific integrated circuits), computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

These computer programs (also known as programs, software, software applications or code) include machine instructions for a programmable processor, and can be implemented in a high-level procedural and/or object-oriented programming language, and/or in assembly/machine language. As used herein, the terms "machine-readable medium" "computer-readable medium" refers to any computer program product, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The term "machine-readable signal" refers to any signal used to provide machine instructions and/or data to a programmable processor.

To provide for interaction with a user, the systems and techniques described here can be implemented on a computer having a display device (e.g., a CRT (cathode ray tube) or LCD (liquid crystal display) monitor) for displaying information to the user and a keyboard and a pointing device (e.g., a mouse or a trackball) by which the user can provide input to the computer. Other kinds of devices can be used to provide for interaction with a user as well; for example, feedback provided to the user can be any form of sensory feedback (e.g., visual feedback, auditory feedback, or tactile feedback); and input from the user can be received in any form, including acoustic, speech, or tactile input.

The systems and techniques described here can be implemented in a computing system that includes a back end component (e.g., as a data server), or that includes a middleware component (e.g., an application server), or that includes a front end component (e.g., a client computer having a graphical user interface or a Web browser through which a user can interact with an implementation of the systems and techniques described here), or any combination of such back end, middleware, or front end components. The components of the system can be interconnected by any form or medium of digital data communication (e.g., a communication network). Examples of communication networks include a local area network ("LAN"), a wide area network ("WAN"), peer-to-peer networks (having ad-hoc or static members), grid computing infrastructures, and the Internet.

The computing system can include clients and servers. A client and server are generally remote from each other and typically interact through a communication network. The relationship of client and server arises by virtue of computer programs running on the respective computers and having a client-server relationship to each other.

Although a few implementations have been described in detail above, other modifications are possible. Moreover, other mechanisms for performing the systems and methods described in this document may be used. In addition, the logic flows depicted in the figures do not require the particular order shown, or sequential order, to achieve desirable results. Other steps may be provided, or steps may be eliminated, from the described flows, and other components may be added to, or removed from, the described systems. Accordingly, other implementations are within the scope of the following claims.

What is claimed is:

1. A method for configuring an electronic test instrument to analyze an input signal, comprising:
   receiving, by the electronic test instrument while the electronic test instrument is in a first digital filtering configuration, a first signal at a physical input to a channel of the electronic test instrument;
   generating, by the electronic test instrument while in the first digital filtering configuration, a digital representation of the first signal by sampling the first signal with an analog-to-digital converter;
   storing, by the electronic test instrument while in the first digital filtering configuration, the digital representation of the first signal in acquisition memory of the electronic test instrument;
   accessing, by the electronic test instrument while in the first digital filtering configuration, the digital representation of the first signal from the acquisition memory, and digitally filtering the digital representation of the first signal that was accessed from the acquisition memory while the electronic test instrument is in the first digital filtering configuration;
   receiving, by the electronic test instrument, user input that modifies a characteristic of the channel of the electronic test instrument, and as a result changing the electronic test instrument from having the first digital filtering configuration to having a second digital filtering configuration, the first digital filtering configuration specifying that all or a majority of digital filtering occurs after the acquisition memory in the channel and the second digital filtering configuration specifying that all or a majority of digital filtering occurs before the acquisition memory in the channel;
   receiving, by the electronic test instrument while in the second digital filtering configuration, a second signal at the physical input to the channel of the electronic test instrument;
   generating, by the electronic test instrument while in the second digital filtering configuration, a digital representation of the second signal by sampling the second signal with the analog-to-digital converter;
   digitally filtering, by the electronic test instrument while in the second digital filtering configuration, the digital representation of the second signal before the digital representation of the second signal is stored by the acquisition memory;
   storing, by the electronic test instrument while in the second digital filtering configuration, the digital representation of the second signal that has been digitally filtered in acquisition memory; and
   accessing, by the electronic test instrument while the electronic test instrument is in the second digital filtering configuration, the digital representation of the second signal from acquisition memory.

2. The method of claim 1, wherein:
   the electronic test instrument includes a reconfigurable digital hardware filter;
   digitally filtering the digital representation of the first signal while in the first digital filtering configuration comprises the reconfigurable digital hardware filter digitally filtering the digital representation of the first signal using the first digital filtering configuration; and
   digitally filtering the digital representation of the second signal while in the second digital filtering configuration comprises the reconfigurable digital hardware filter digitally filtering the digital representation of the second signal using the second digital filtering configuration.

3. The method of claim 2, wherein the first digital filtering configuration has all digital filtering performed by the reconfigurable digital hardware filter occurring after the acquisition memory in the channel and no digital filtering by the reconfigurable digital hardware filter occurring before the acquisition memory in the channel.

4. The method of claim 3, wherein the second digital filtering configuration has all digital filtering by the reconfigurable digital hardware filter occurring before the acquisition memory in the channel and no digital filtering by the reconfigurable digital hardware filter occurring after the acquisition memory in the channel.

5. The method of claim 1, wherein:
   receiving the user input that modifies the characteristic of the channel of the electronic test instrument comprises receiving user input that changes a setting of the electronic test instrument that causes the electronic test instrument to change from not decimating a digital representation of a signal acquired by the channel to decimating the digital representation of the signal acquired by the channel; and
   the method further comprises decimating, by the electronic test instrument while in the second digital filtering configuration, the digital representation of the second signal after the digital representation of the second signal has been filtered and before the digital representation of the second signal has been stored in the acquisition memory, the digital representation of the second signal that the electronic test instrument stores in the acquisition memory being a decimated version of the digital representation of the second signal.

6. The method of claim 5, wherein receiving the user input that modifies the characteristic of the channel of the electronic test instrument comprises receiving user input that changes the electronic test instrument from sampling at a full sample rate to sampling at a rate below the full sample rate.

7. The method of claim 5, wherein receiving the user input that modifies the characteristic of the channel of the electronic test instrument comprises receiving user input that increases a time period of signal storage by the acquisition memory to be greater than a time period that the acquisition memory is capable of storing the signal acquired by the channel at a full sample rate.

8. The method of claim 1, wherein:
   digitally filtering the digital representation of the first signal while the electronic test instrument is in the first digital filtering configuration comprises digitally filtering the digital representation of the first signal to compensate for changes to the first signal caused by the physical input to the channel of the electronic test instrument and a physical probe used to acquire the first signal and provide the first signal to the physical input to the channel; and
   digitally filtering the digital representation of the second signal while the electronic test instrument is in the second digital filtering configuration comprises digitally filtering the digital representation of the second signal to compensate for changes to the second signal caused by the physical input to the channel of the electronic test instrument and a physical probe used to acquire the second signal and provide the second signal to the physical input to the channel.

9. The method of claim 1, wherein:
the first digital filtering configuration implements a first filter having a first number of stages after the acquisition memory in the channel, the first digital filtering configuration implementing the first filter using a first amount of compute elements for each stage of the first filter;
the second digital filtering configuration implements a second filter having a second number of stages before the acquisition memory in the channel, the second digital filtering configuration implementing the second filter using a second amount of compute elements for each stage of the second filter;
the first filter is longer than the second filter, such that the first number of stages of the first filter is greater than the second number of stages of the second filter; and
the second filter is implemented using more compute elements for each stage of the second filter than is used for each stage of the first filter, such that the second amount of compute elements per stage of the second filter is greater than the first amount of compute elements per stage of the first filter.

10. The method of claim 1, wherein:
the first digital filtering configuration uses a same collection of compute elements of a reconfigurable digital hardware filter, configured to perform the digital filtering of the digital representation of the first signal accessed from the acquisition memory; and
the second digital filtering configuration uses the same collection of compute elements of the reconfigurable digital hardware filter, reconfigured to perform the digital filtering of the digital representation of the second signal before the digital representation of the second signal is stored by the acquisition memory.

11. An electronic test instrument, comprising:
a physical input for a channel of the electronic test instrument to receive a signal;
an analog-to-digital converter after the physical input in the channel to receive the signal from the physical input and generate a digital representation of the signal;
acquisition memory after the analog-to-digital converter in the channel to store the digital representation of the signal;
a reconfigurable digital hardware filter configured to switch from (i) implementing a digital filter after the acquisition memory in the channel to (ii) implementing a digital filter between the analog-to-digital converter and the acquisition memory in the channel;
second memory after the acquisition memory in the channel to store the digital representation of the signal after retrieval of the digital representation of the signal from the acquisition memory;
a user interface to receive user input specifying an operating condition of the electronic test instrument; and
a computer to change a configuration of the reconfigurable digital hardware filter from (i) a first digital filter configuration that implements all or a majority of digital filtering performed by the reconfigurable digital hardware filter after the acquisition memory in the channel, to (ii) a second digital filter configuration that implements all or a majority of digital filtering performed by the reconfigurable digital hardware filter before the acquisition memory in the channel, based on the computer determining that user input interacted with the user interface to change the operating condition of the electronic test instrument.

12. The electronic test instrument of claim 11, wherein:
the first digital filter configuration implements all digital filtering performed by the reconfigurable digital hardware filter after the acquisition memory in the channel, and
the second digital filter configuration implements at least some digital filtering performed by the reconfigurable digital hardware filter before the acquisition memory in the channel.

13. The electronic test instrument of claim 11, wherein:
the first digital filter configuration implements all digital filtering performed by the reconfigurable digital hardware filter after the acquisition memory in the channel, and
the second digital filter configuration implements all digital filtering performed by the reconfigurable digital hardware filter before the acquisition memory in the channel.

14. The electronic test instrument of claim 11, wherein the computer is configured to change the configuration of the reconfigurable digital hardware filter from the first digital filter configuration to the second digital filter configuration, based on the computer determining that user input interacted with the user interface to change a setting of the electronic test instrument that causes the electronic test instrument to change from not decimating the digital representation of the signal before storage by the acquisition memory to decimating the digital representation of the signal before storage by the acquisition memory.

15. The electronic test instrument of claim 14, wherein the user input that changes the setting includes user input that changes the electronic test instrument from sampling at a full sample rate to sampling at a rate below the full sample rate.

16. The electronic test instrument of claim 14, wherein the user input that changes the setting includes user input that increases a time period of signal storage by the acquisition memory to be greater than a time period that the acquisition memory is capable of storing the signal at a full sample rate.

17. The electronic test instrument of claim 11, wherein:
the first digital filtering configuration implements a first filter having a first number of stages after the acquisition memory in the channel, the first digital filtering configuration implementing the first filter using a first amount of compute elements for each stage of the first filter;
the second digital filtering configuration implements a second filter having a second number of stages before the acquisition memory in the channel, the second digital filtering configuration implementing the second filter using a second amount of compute elements for each stage of the second filter;
the first filter is longer than the second filter, such that the first number of stages of the first filter is greater than the second number of stages of the second filter; and
the second filter is implemented using more compute elements for each stage of the second filter than is used for each stage of the first filter, such that the second amount of compute elements per stage of the second filter is greater than the first amount of compute elements per stage of the first filter.

18. The electronic test instrument of claim 11, wherein:
the first digital filter configuration uses a same collection of compute elements of the reconfigurable digital hardware filter to implement the digital filter after the acquisition memory in the channel; and
the second digital filter configuration uses the same collection of compute elements of the reconfigurable digital hardware filter to implement the digital filter between the analog-to-digital converter and the acquisition memory in the channel.

19. A method for configuring an electronic test instrument to analyze an input signal, comprising:
receiving, by the electronic test instrument while the electronic test instrument is in a first digital filtering configuration, a first signal at a physical input to a channel of the electronic test instrument;
generating, by the electronic test instrument while in the first digital filtering configuration, a digital representation of the first signal by sampling the first signal with an analog-to-digital converter;
digitally filtering, by the electronic test instrument while in the first digital filtering configuration, the digital representation of the first signal using a first filter implemented by a reconfigurable digital hardware filter, the first filter having a first number of stages;
storing, by the electronic test instrument while in the first digital filtering configuration, the digital representation of the first signal in memory after the digital representation of the first signal has been filtered with the first filter;
receiving, by the electronic test instrument, user input that modifies a characteristic of the channel of the electronic test instrument, and as a result changing the electronic test instrument from having the first digital filtering configuration to a second digital filtering configuration, the first digital filtering configuration specifying use of the first filter with the first number of stages and the second digital filtering configuration specifying use of a second filter with a second number of stages instead of the first filter, the second number of stages being different than the first number of stages;
receiving, by the electronic test instrument while in the second digital filtering configuration, a second signal at the physical input to the channel of the electronic test instrument;
generating, by the electronic test instrument while in the second digital filtering configuration, a digital representation of the second signal by sampling the second signal with the analog-to-digital converter;
digitally filtering, by the electronic test instrument while in the second digital filtering configuration, the digital representation of the second signal using the second filter that is implemented by the reconfigurable digital hardware filter; and
storing, by the electronic test instrument, the digital representation of the second signal after the digital representation of the second signal has been filtered with the second filter.

* * * * *